United States Patent
Willen et al.

(10) Patent No.: US 7,593,815 B2
(45) Date of Patent: Sep. 22, 2009

(54) ESTIMATING NOISE AT ONE FREQUENCY BY SAMPLING NOISE AT OTHER FREQUENCIES

(75) Inventors: Dennis E. Willen, Houston, TX (US); Xinyou Lu, Missouri City, TX (US)

(73) Assignee: ExxonMobil Upstream Research Company, Houston, TX (US)

( * ) Notice: Subject to any disclaimer, the term of this patent is extended or adjusted under 35 U.S.C. 154(b) by 134 days.

(21) Appl. No.: 11/793,121

(22) PCT Filed: Jan. 17, 2006

(86) PCT No.: PCT/US2006/001555

§ 371 (c)(1), (2), (4) Date: Jun. 14, 2007

(87) PCT Pub. No.: WO2006/088591

PCT Pub. Date: Aug. 24, 2006

(65) Prior Publication Data

US 2008/0059072 A1    Mar. 6, 2008

Related U.S. Application Data

(60) Provisional application No. 60/653,427, filed on Feb. 16, 2005, provisional application No. 60/654,595, filed on Feb. 18, 2005.

(51) Int. Cl.
*G01F 19/00* (2006.01)
(52) U.S. Cl. ............................ 702/6; 324/500
(58) Field of Classification Search .......... 702/6, 702/14, 182–185, 188; 324/500, 512
See application file for complete search history.

(56) References Cited

U.S. PATENT DOCUMENTS

| | | | |
|---|---|---|---|
| 4,339,720 A | 7/1982 | Halverson | 324/362 |
| 4,344,150 A | 8/1982 | McLaughlin et al. | 364/724 |
| 4,812,766 A | 3/1989 | Klein | 324/262 |
| 4,996,484 A | 2/1991 | Spies et al. | 324/334 |
| 6,535,818 B1 | 3/2003 | Baeten | 702/17 |
| 6,603,313 B1 | 8/2003 | Srnka et al. | 324/354 |
| 7,191,063 B2 | 3/2007 | Tompkins | 702/2 |

(Continued)

FOREIGN PATENT DOCUMENTS

| | | |
|---|---|---|
| EP | 0 681 193 | 11/1995 |
| GB | 2396013 | 6/2004 |
| WO | WO 03/025803 | 3/2003 |
| WO | WO 2005/010560 | 2/2005 |
| WO | WO 2005/117326 | 12/2005 |

OTHER PUBLICATIONS

Ellingsrud, S. et al. (2002) "Remote Sensing of Hydrocarbon Layers by Seabed Logging (SBL): Results from a Cruise Offshore Angola," *The Leading Edge*, v. 21, No. 10, pp. 972-982.

(Continued)

*Primary Examiner*—Edward Raymond (57) ABSTRACT

A method, apparatus and computer program for improving the signal-to-noise ratio of a signal S(t), S(t) containing Signal and noise, are disclosed. A measurement of S(t) at a frequency-of-interest is obtained. Noise measurements of S(t) at one or more noise frequencies where the Signal portion of S(t) is expected to be small are obtained. The noise at the frequency-of-interest is estimated using the noise measurements at the one or more noise frequencies. The estimated noise is subtracted from the measurement of S(t) at the frequency-of-interest.

36 Claims, 11 Drawing Sheets

U.S. PATENT DOCUMENTS

2003/0050759 A1 3/2003 Srnka et al.
2006/0197534 A1 9/2006 Green et al.

OTHER PUBLICATIONS

Larsen, J. C. et al. (1996) "Robust Smooth Magnetotelluric Transfer Functions," *Geophysical Journal International*, vol. 124, pp. 801-819.

Larsen, J. C. et al. (1997) "Noise Reduction in Electromagnetic Time Series to Improve Detection of Seismic-Induced Signals," *Journal of Geomagnetism and Geoelectricity*, vol. 49, 1257-1265.

Ursin, Bjorn (2003) "Noise Reduction on SBL Data," Force Workshop, Stavanger, Norway, Sep. 2003 emgs/NTNU, 23 pages.

European Search Report No. RS 112435, dated Oct. 5, 2005, 2 pgs.

PCT International Search and Written Opinion, dated Jan. 5, 2007, 7 pgs.

ESTIMATING NOISE AT ONE FREQUENCY BY SAMPLING NOISE AT OTHER FREQUENCIES

This application is the National Stage of International Application No. PCT/US2006/01555, filed 17 Jan. 2006, which claims the benefit of both U.S. Provisional Patent Application Nos. 60/653,427 filed 16 Feb. 2005 and 60/654,595 filed 18 Feb. 2005.

BACKGROUND

Electromagnetic soundings, including controlled source electromagnetic ("CSEM") experiments, are conducted by transmitting an electromagnetic signal, typically a low-frequency periodic waveform, into the subsurface, and measuring the electromagnetic response. U.S. Pat. No. 6,603,313 to Srnka and U.S. Patent Publication No. 2003/0050759 (PCT Publication No. WO 03/025803) by Srnka and Carazzone disclose methods for using CSEM measurements to prospect for oil and gas, and to delineate known prospects.

Figure 1:
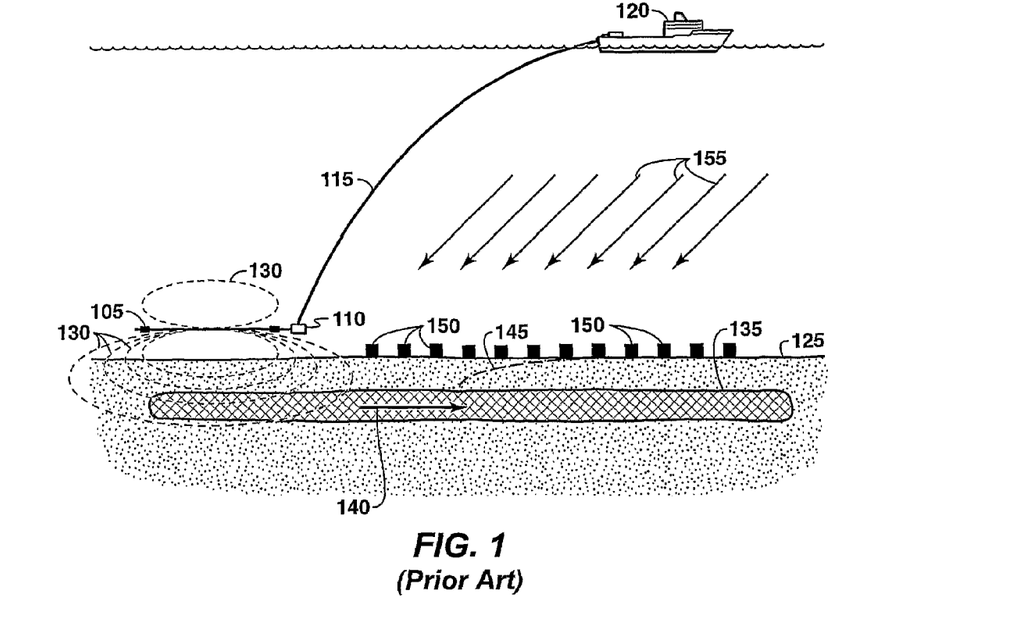
FIG. 1 illustrates the operating environment for a CSEM survey.

As illustrated in FIG. 1, which shows an example of the equipment involved in performing a marine CSEM survey, one end of an antenna 105 is attached to a tow body 110, which is lowered to the desired water depth via a sub-sea tow cable 115. The tow body 110 is more than just an anchor point for the tow cable. It provides a place to contain the electrical components necessary for generating an electromagnetic source wave, and also may contain communication systems, positioning systems, speed of sound measuring devices, altimeters and the like, that are useful in surveying. A winch (not shown), attached to a surface vessel 120, controls the tow cable 115.

The antenna 105 is the transducer of electromagnetic fields used for the CSEM survey. Marine CSEM surveys typically use horizontal electric dipoles (HED) which may be made as follows. Two insulated wires are extended from two output terminals of a power generator capable of supplying electrical power with a desired frequency and waveform. The other end of each insulated wire is connected to an electrode. Alternatively, the insulation may be stripped from the end of the insulated wire and the bare wire becomes the electrode. The two electrodes are maintained a fixed distance apart. The dipole axis is maintained in a horizontal posture in the case of an HED. A current loop between the two electrodes is completed in a marine application by the water, the sea bottom, and possibly the air above the water.

The antenna 105 generates a time-varying electromagnetic field 130 which, in the example shown in FIG. 1, penetrates the sea bottom 125 to a formation 135. The time-varying electromagnetic field causes a time-varying current 140 to flow in the formation 135. The flow of the time-varying current 140 through the formation 135 induces another electromagnetic field 145. An array of sensors 150, typically located on the sea floor, receives, detects, and analyzes the electromagnetic field 145, and stores the resulting data or reports it to the surface for analysis. The characteristics of the received electromagnetic field 145 depend on the characteristics of the transmitted electromagnetic field 130, which are known to some degree, the characteristics of the formation 135, the characteristics of other subsurface features and formations, and noise. It is possible to determine some of the characteristics of the formation 135 by analyzing the received electromagnetic field 145 in this context.

Figure 2:
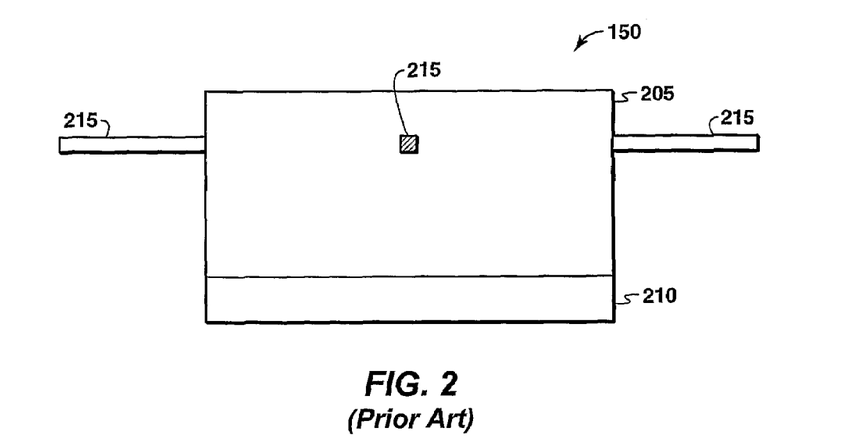
FIG. 2 illustrates a CSEM survey sensor.

A typical sensor 150, illustrated in FIG. 2, includes an electronics package 205 coupled to a ballast 210. The electronics package 205 includes four antennae 215 arranged approximately symmetrically around its periphery. The four antennae form two electric dipoles, as described above. One or more vertical antennae (not shown) may also be included to detect vertically oriented electromagnetic radiation. The antennae 215 receive the electromagnetic field 145 and equipment in the electronics package 205 detect, analyze and record data related to the phase and amplitude of the electromagnetic field 145. When sufficient data has been recorded or after a certain period of time has passed, the electronics package 205 releases from the ballast 210 and floats to the surface where it is recovered. On the surface, data is recovered from the electronics package 205. The data are analyzed.

A survey is composed of the data collected as the result of one or more traverses of the antenna 105 over an area of the seafloor containing one or more sensors 150. Typically, each of the traverses is known as a "towline."

One of the most significant sources of noise for the CSEM application is magnetotelluric noise 155, shown on FIG. 1 as a set of arrowed lines. In addition, noise may stem from seafloor oceanic currents triggering mechanical vibration of the antennae ("strum") or from imperfections in the sensor electronics.

SUMMARY

In general, in one aspect the invention features a method for improving the signal-to-noise ratio of a signal S(t), S(t) containing Signal and noise. The method includes (a) obtaining a measurement of S(t) at a frequency-of-interest, (b) obtaining noise measurements of S(t) at one or more noise frequencies where the Signal portion of S(t) is expected to be small, (c) estimating the noise at the frequency-of-interest using the noise measurements at the one or more noise frequencies, and (d) subtracting the estimated noise from the measurement of S(t) at the frequency-of-interest.

Implementations of the invention may include one or more of the following. The method may further include repeating (a), (b), (c) and (d). Estimating the noise at the frequency-of-interest, N(T), may include minimizing $$\sum_{T \in [T_1, T_2]} |S(T) - N(T)|^2$$

where $N(T)=c_1 n_1(T)+c_2 n_2(T)+c_3 n_3(T)+ \ldots$ ; and where $c_1, c_2, c_3 \ldots$ are complex coefficients; $n_1, n_2, n_3, \ldots$ are the measurements of noise at the noise frequencies; and T1 and T2 define a time period when little or no Signal is present in S(t). Obtaining noise measurements of S(t) at the one or more noise frequencies may include selecting the noise frequencies such that they will readily model the noise at the frequency-of-interest. Obtaining noise measurements of S(t) at the one or more noise frequencies may include selecting the noise frequencies to be close to the frequency-of-interest. Obtaining noise measurements of S(t) at the one or more noise frequencies may include obtaining measurements of S(t) at a time when the Signal portion of S(t) is expected to be small. The measurements may include data. The data may include offset, amplitude and phase. Estimating the noise may include sorting the data into bins, each bin being associated with a respective range of offsets; transforming the data in each bin into the frequency domain; selecting from each bin data associated with the frequency-of-interest; selecting from each bin data associated with the one or more noise frequencies; estimating, for each bin, a frequency-of-interest noise from the selected noise frequency data; and subtracting, on a bin-by-bin basis, the estimated frequency-of-interest noise from the data associated with the frequency-of-interest. Obtaining a measurement of S(t) at the frequency-of-interest may include obtaining measurements of the complex amplitude of S(t) at the frequency-of-interest. Obtaining noise measurements of S(t) at the one or more noise frequencies may include obtaining measurements of the complex amplitude of S(t) at the one or more noise frequencies. Estimating the noise may include estimating the complex amplitude of the noise at the frequency-of-interest using the complex amplitudes of S(t) obtained at the one or more noise frequencies. Subtracting the estimated noise may include subtracting the complex amplitude of the estimated noise at the frequency-of-interest from the complex amplitude of S(t) obtained at the frequency-of-interest.

It should be noted that the time variable t in S(t) refers to time as a measure of source position relative to receiver position. This is not the time variable that is converted to frequency when the data in each bin are transformed to the frequency domain. The Fourier-transformed time variable is, for example, the time variable represented on the horizontal axis of FIG. 5, whereas the time variable in S(t) denotes the time at the bin centers after spectral decomposition (transformation to the frequency domain).

The method may include generating a CSEM signal having a large amount of energy at the frequency-of-interest and small amount of energy at a plurality of low-signal frequencies. The method may further include transmitting the CSEM signal and receiving the signal S(t). The method may further include selecting a frequency for the CSEM signal. Generating the CSEM signal may include generating a CSEM signal in which the energy of the CSEM signal is concentrated into temporal frequencies suited to distinguish hydrocarbon reservoirs. The method may further include selecting the noise frequencies to coincide with a subset of the low-signal frequencies. The method may further include selecting the noise frequencies to avoid frequency components of the transmitted CSEM signal. Generating a CSEM signal may include generating a square wave. Generating a CSEM signal may include generating a tripeak wave.

In general, in another aspect, the invention features a computer program, stored in a tangible medium, for improving the signal-to-noise ratio of a signal S(t), S(t) containing Signal and noise. The program includes executable instructions that cause a computer to (a) obtain a measurement of S(t) at a frequency-of-interest; (b) obtain noise measurements of S(t) at a plurality of noise frequencies where the Signal portion of S(t) is expected to be small; (c) estimate the noise at the frequency-of-interest using the noise measurements at the one or more noise frequencies; and (d) subtract the estimated noise from the measurement of S(t) at the frequency-of-interest.

In general, in another aspect, the invention features a CSEM apparatus for estimating noise at one frequency in a signal S(t), which contains Signal and noise, by sampling noise in S(t) at other frequencies. The apparatus includes a noise estimator to determine an estimate of the noise in S(t) at a frequency-of-interest using the measured noise in S(t) at certain noise frequencies and a noise subtractor to subtract the estimate of noise from S(t) at the frequency-of-interest.

Implementations of the invention may include one or more of the following. The CSEM apparatus may further include one or more antennae; one or more analog to digital converters coupled to the antennae, each producing data representing S(t); and a data transformer to transform the data from the time domain to the frequency domain. The CSEM apparatus may further include a recorder coupled to the analog to digital converter, the recorder recording the output of the analog to digital converter. The CSEM apparatus may further include a data binner coupled to the analog to digital converter to sort its output into bins based on offset. The CSEM apparatus may further include conditioning components coupled to the antennae. The noise estimator may minimize $$\sum_{T \in \{T_1, T_2\}} |S(T) - N(T)|^2$$

where $N(T) = c_1 n_1(T) + c_2 n_2(T) + c_3 n_3(T) + \ldots$; $c_1, c_2, c_3 \ldots$ are complex coefficients; $n_1, n_2, n_3, \ldots$ are the measurements of noise at the noise frequencies; and T1 and T2 define a time period when little or no Signal is present in S(t). The noise estimator may estimate the noise received on a single antenna. The noise estimator may estimate the noise received on two or more antennae.

DETAILED DESCRIPTION

To avoid confusion, the word Signal, when capitalized, refers to the signal component of a signal (uncapitalized) that includes both Signal and noise. A CSEM system increases the signal-to-noise ratio of CSEM data by transmitting a CSEM electromagnetic signal that has known gaps in its spectrum; receiving a CSEM electromagnetic signal that in a linear noiseless environment would be expected to have the same spectral content as the transmitted CSEM electromagnetic signal; using the noise received in the known gaps to estimate the noise at frequencies-of-interest where Signal is expected to be found; and subtracting the estimated noise from the received CSEM electromagnetic signal at the frequencies-of-interest.

Figures 3, 4:
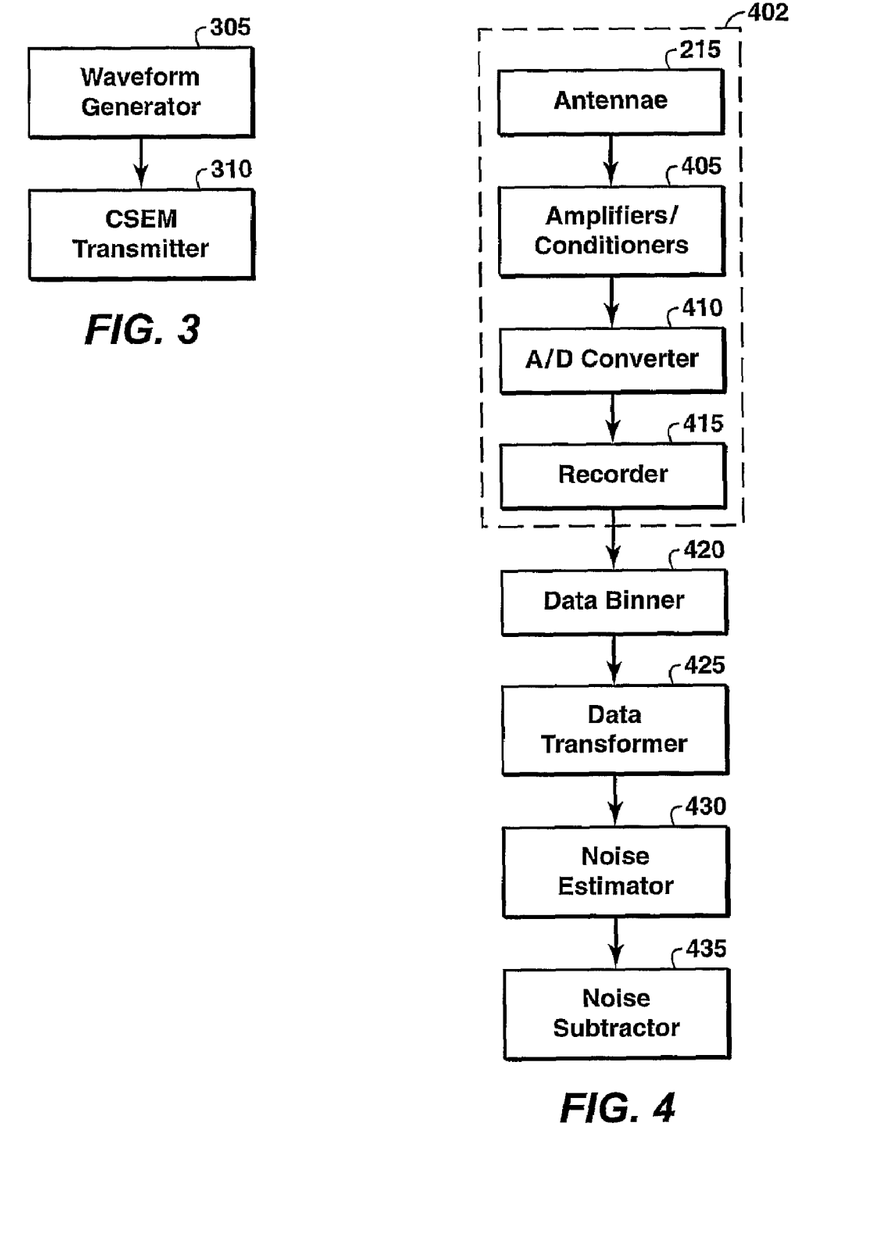
FIG. 3 is a block diagram of a transmitter for use in a CSEM survey.
FIG. 4 is a block diagram of a device to receive and process CSEM data.

An example of apparatus to generate the transmitted CSEM electromagnetic signal 130, which is typically located in the tow body 110, is illustrated in FIG. 3. It includes a waveform generator 305 that generates a waveform having desired characteristics. The waveform generator 305 is coupled to a CSEM transmitter 310, which transmits the generated waveform through the antenna 105 and creates the transmitted electromagnetic field 130.

In a typical CSEM application, the waveform is selected to concentrate the available transmitter power into a few selected temporal frequencies, which are chosen to best distinguish hydrocarbon reservoirs in the subsurface. The transmitter current takes a form that repeats in time, such as the square wave shown in FIG. 5. or the tripeak waveform shown in FIG. 6. The tripeak waveform shown in FIG. 6 is of the type disclosed in PCT International Patent Publication Number WO2005/117326 entitled Logarithmic Spectrum Transmitter Waveform for Controlled-Source Electromagnetic Surveying, by Lu and Srnka, filed on May 20, 2004.

Figure 5:
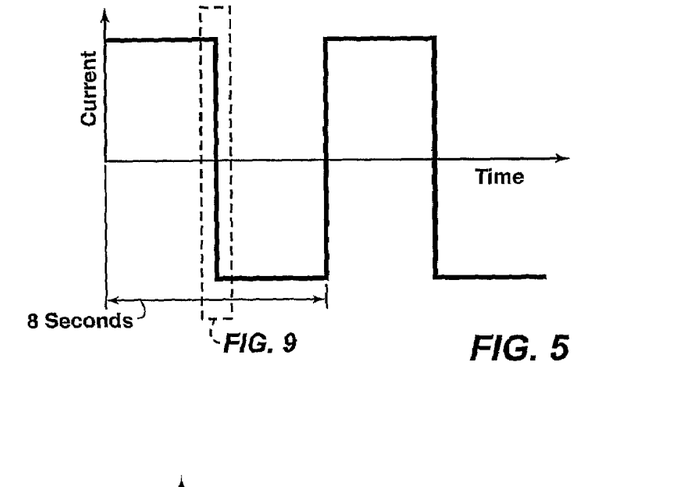
FIG. 5 illustrates an ideal square wave.
Figure 6:
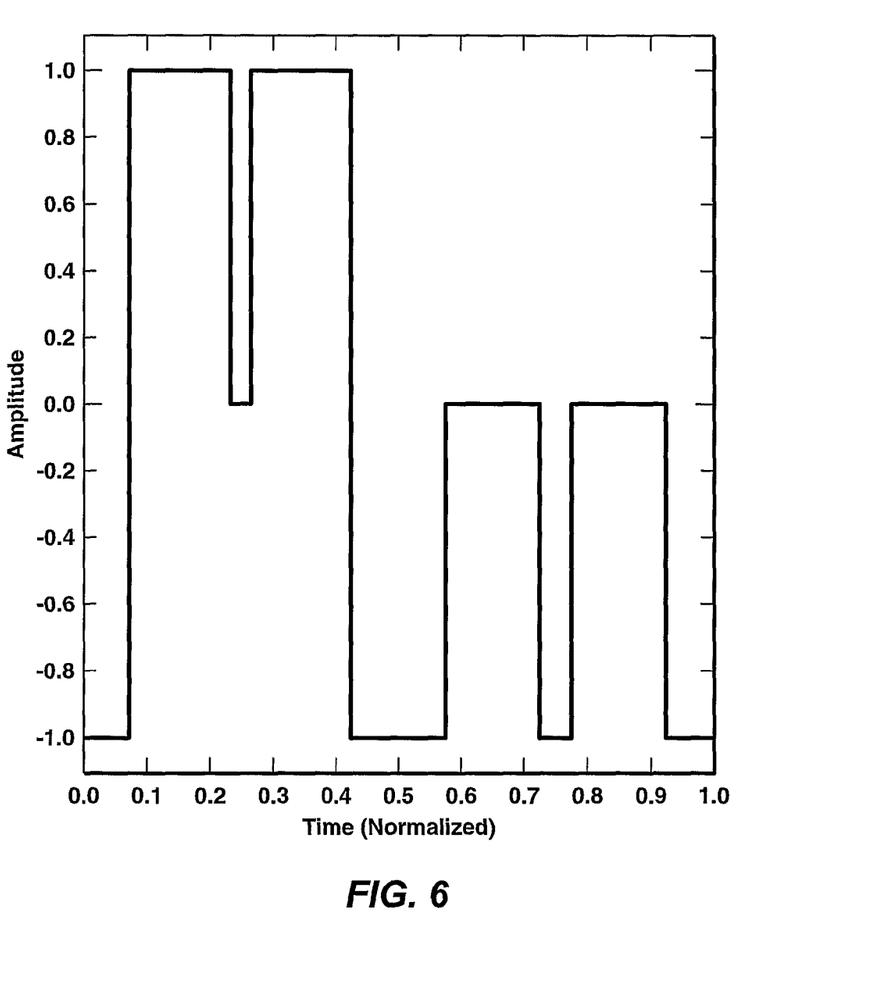
FIG. 6 illustrates an ideal tripeak wave.
Figures 7, 9:
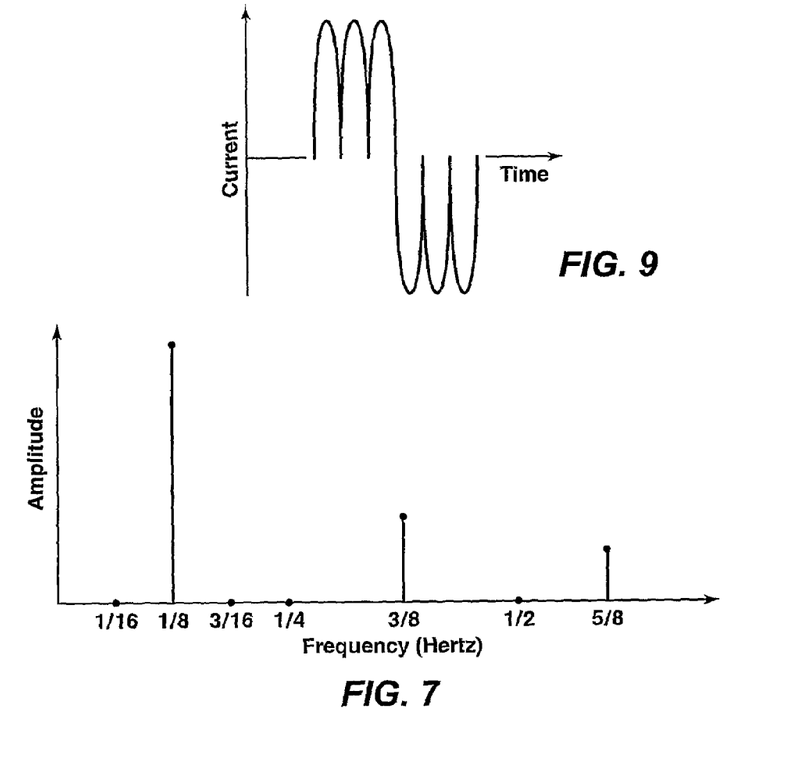
FIG. 7 shows a portion of the spectrum of an ideal square wave.
FIG. 9 illustrates a segment of a practical high-power square wave.

It is well known from the theory of Fourier Analysis that non-sinusoidal waveforms such as those shown in FIGS. 5 and 6 are equivalent to a sum of sinusoidal waveforms, each representing a specific temporal frequency. After Fourier Analysis, the amplitude of each sinusoid represents the relative contribution of its frequency to the non-sinusoidal waveform. The lowest such frequency generally corresponds to the period over which the waveform repeats. For example, if the symmetric 8-second square wave shown in FIG. 5 is repeated, the resulting continuous waveform is composed of frequencies $(2*N+1)/8$ Hz, where $N=0, 1, 2, \ldots$, or ⅛, ⅜, ⅝ Hz, etc. These frequencies and the amplitude of the signal at each of these frequencies are illustrated in FIG. 7. The following tables 1 and 2 describe a continuous square wave and its first few frequency components, where T is the period of the square wave (e.g., 8 seconds in FIG. 5):

TABLE 1

Square Wave Transitions

| Transition | Time |
| --- | --- |
| 1 to −1 | T/2 |
| −1 to 1 | T |

TABLE 2

First Few Frequency Components of a Symmetric Square Wave

| Frequency | Amplitude | Phase |
| --- | --- | --- |
| 1/T | 1.2732 | 0.0 |
| 3/T | 0.4244 | 0.0 |
| 5/T | 0.2546 | 0.0 |
| 7/T | 0.1819 | 0.0 |
| 9/T | 0.1415 | 0.0 |
| 11/T | 0.1157 | 0.0 |
| 13/T | 0.0979 | 0.0 |
| 15/T | 0.0849 | 0.0 |
| 17/T | 0.0749 | 0.0 |
| 19/T | 0.0670 | 0.0 |
| 21/T | 0.0606 | 0.0 |

Figure 8:
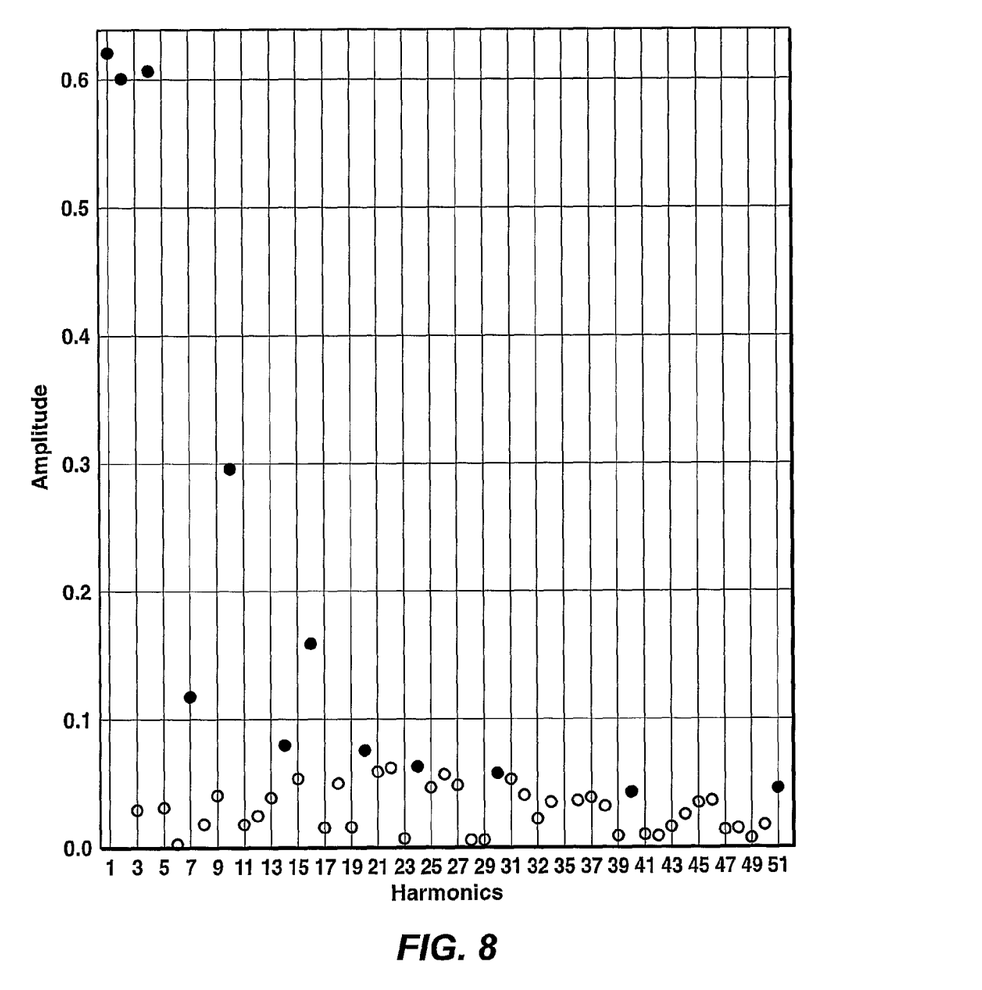
FIG. 8 shows a portion of the spectrum of an ideal tripeak wave.

Tables 3 and 4 below describe a continuous tripeak waveform and its first few frequency components, where T is the period of the tripeak waveform. These frequencies and the amplitude of the signal at each of these frequencies are illustrated in FIG. 8.

TABLE 3

Tripeak Wave Transitions

| Transition | Time |
| --- | --- |
| −1 to 1 | 18 * T/256 |
| 1 to 0 | 60 * T/256 |
| 0 to 1 | 67 * T/256 |

TABLE 3-continued

Tripeak Wave Transitions

| Transition | Time |
| --- | --- |
| 1 to −1 | 110 * T/256 |
| −1 to 0 | 147 * T/256 |
| 0 to −1 | 186 * T/256 |
| −1 to 0 | 198 * T/256 |
| 0 to −1 | 237 * T/256 |

TABLE 4

First Few Frequency Components of Tripeak Wave

| Frequency | Amplitude | Phase |
| --- | --- | --- |
| 1/T | 0.6212 | 0.0 |
| 2/T | 0.6010 | −90.0 |
| 4/T | 0.6064 | −90.0 |
| 7/T | 0.1183 | 180.0 |
| 10/T | 0.2966 | 90.0 |
| 14/T | 0.0801 | 90.0 |
| 16/T | 0.1596 | −90.0 |
| 20/T | 0.0756 | −90.0 |

Practical high power transmitters do not generate ideal square waves as shown in FIG. 5 or ideal tripeak waves as shown in FIG. 6. They generate more complex waveforms, such as that shown in FIG. 9, in which the positive excursions are composed of positive lobes of a rectified alternating current and the negative excursions are composed of negative lobes of the rectified alternating current. The frequency content of such complex waveforms will not have the clean spectrum shown in FIGS. 7 and 8.

An example of apparatus to detect and process the received CSEM electromagnetic signal 145, illustrated in FIG. 4, includes the antennae 215. The antennae 215 are coupled to amplifiers and conditioners 405, which amplify and condition the signal from the antennae. Conditioning may include filtering, attenuating, or delaying part or all of the received signal. The amplifiers and conditioners 405 are coupled to an analog to digital (A/D) converter 410 which converts the analog signal to a digital representation. The A/D converter has a wide enough bandwidth and dynamic range to record the signal for analysis. Particularly for the signal-to-noise improvement apparatus described herein, the A/D converter has sufficient bandwidth to capture the frequencies where little or no Signal is expected, as described below. An example A/D converter operates at 31.125 Hz and provides a 24-bit output. Another example A/D converter operates at 50 Hz.

As can be seen from Table 4 and FIG. 8, much of the energy in a tripeak waveform with an 8-second period is at discrete frequencies ⅛ Hz, ⅖ Hz, and ⅘ Hz. By contrast, the A/D converter samples at a much finer time interval, such as 0.032 seconds, allowing the A/D converter to reliably capture frequencies from 0 Hz (direct current) to the Nyquist cutoff frequency at 15.625 Hz. As a result, the data output from the A/D converter contains many frequencies other than those transmitted. For example, in the case of tripeak wave with an 8-second period (T=8), the output of an A/D converter sampling at 0.032 second intervals would contain, not just the frequencies-of-interest shown in Table 4 (i.e., ⅛, ⅖, ⅘, ⅞, ¹⁰⁄₈, ¹⁴⁄₈, and ²⁰⁄₈ Hz), but also ⅜, ⅝, ⁶⁄₈, etc. Hz. where only noise energy is expected to be found.

Turning back to FIG. 4, the output of the analog to digital converter 410 is optionally coupled to a recorder 415, which records the digital data for later processing. In some configurations the recorder 415 is not used. In some configurations, the data is analyzed in real time.

The recorded data are then provided to a data binner 420. The data binner 420 extracts a time segment of recorded data corresponding to a towline and divides that segment into bins. Each bin is associated with an interval of time ranging generally between 2 and 128 seconds. In the case of a moving source, that time interval may correspond to a range of offsets that range generally falling between 50 and 600 meters. Offset is defined to be the signed distance, which is sometimes expressed as time and sometimes as a physical distance, from the antenna 105 to the sensor 150 that received the data being binned. Thus, each towline has associated with it a set of bins, each of which contains a time segment of data from that towline.

The data in each bin are then transformed by a data transformer 425 from the time domain into the frequency domain. The data transformer 425 also collects the resulting complex amplitude data (i.e., amplitude and phase) from all of the bins for one or more frequencies to be used in subsequent analysis. For example, the data transformer 425 may collect the ⅛ Hz amplitude and phase data from each of the bins. The result would be a data collection such as that shown in FIG. 11. As can be seen, FIG. 11 has two charts for data collected at 1/16 Hz. Both charts have offset measured in Julian days as the horizontal axis. In one chart, the vertical axis is the amplitude of energy at the corresponding offset on the horizontal axis at 1/16 Hz. In the other chart, the vertical axis is related to the phase of energy at the corresponding offset on the horizontal axis at 1/16 Hz. Each individual point in the curves shown in the two charts in FIG. 11 corresponds to the data in a single bin.

The data collected by the data transformer 425 are provided to a noise estimator 430. The noise estimator estimates the noise at frequencies where Signal power is expected using the noise collected at frequencies where no Signal power is expected. For example, using the spectrum illustrated in FIG. 7 as an example, the noise at ⅛, ⅜ and ⅝ Hz may be estimated using the noise measured at 1/16, 3/16, ¼, and ½ Hz.

In one example system, the noise at a Signal frequency (such as ⅛ Hz in FIG. 7) is modeled by a linear combination of the data at the noise frequencies (such as 1/16, 3/16, ¼ and ½ Hz in FIG. 7). That is, the modeled noise N at any signal frequency and bin time T is given by:

$$N(T) = c_1 n_1(T) + c_2 n_2(T) + c_3 n_3(T) + \quad (1)$$

where $c_1, c_2, \ldots$ are complex coefficients and $n_1, n_2, \ldots$ are recorded data at the selected noise frequencies. The $c_i$ are determined by minimizing in a least-squares sense, the difference between the recorded signal S(t) and the modeled noise over a time period when the source is either inactive or distant enough from the receiver to contribute little recorded Signal. In other words, the $c_i$ are determined by minimizing:

$$\sum_{T \in \{T_1, T_2\}} |S(T) - N(T)|^2 \quad (2)$$

where $\{T1, T2\}$ is a time period when little or no Signal is present and the square is understood to refer to the complex magnitude. The time window $\{T1, T2\}$ is typically chosen using some measure of how well the noise N can be modeled from the $n_i$. In one example system, the time window is chosen when the signal at the frequencies-of-interest and at the noise frequencies are generally in phase and the Signal is weak.

Care should be taken in choosing the noise frequencies $n_i$ that weakly but intentionally transmitted frequencies are not inadvertently considered noise. In particular, the tripeak waveform shown in FIG. 6 contains some harmonics that are generally considered weak, but are strong enough to distort the noise estimate if they are included in the noise estimation process. In particular, an 8-second tripeak waveform will contain very strong Signals at ⅛, ⅜ and ⅝ Hz. It will contain noticeable Signal at ⅞, 10/8, 14/8 and 16/8 Hz and other harmonics. Strong and noticeable Signal are indicated in FIG. 8 by solid circles. Still other, weaker harmonics (⅜, ⅝, ⅞, 12/8, 13/8, . . . Hz) might be considered too weak to provide useful signal but may be strong enough to corrupt a noise estimate if they are included in the calculation. Such weaker and noise-level Signal are indicated in FIG. 8 by open circles. Knowledge of the transmitter waveform and its spectrum will serve as a clear guide to the choice of noise frequencies. For example, given the transmitter spectrum shown in FIG. 8 for an 8-second tripeak waveform, the noise estimator 430 might choose frequencies 41/16 and 43/16 Hz, where no Signal is expected, to estimate the noise at 2⅛ Hz, where Signal is expected.

This technique can be applied independently to measurements recorded by different antenna 215 on a CSEM sensor 150. Alternatively, the technique can be applied to any combination of data from different antennae. In particular, it may be applied to a linear combination of measurements intended to provide the component of the electromagnetic field collinear to or perpendicular to the transmitter antenna. To best address instrument noise, the method would be applied independently to different recording channels within the CSEM sensor 150. A recording channel 402 may include a single antenna 215, a set of amplifiers and conditioners 405, a A/D converter 410, and a recorder 415. Alternatively, each of the antennae 215 may be multiplexed to the same amplifiers/conditioner 405, A/D converter 410, and recorder 415. An electronics package 205 may include one or more recording channels.

This technique can be applied more than once to the same data, as in a case where it is first applied to suppress magnetotelluric noise and then applied a second time to suppress noise from antenna strum.

This technique can be applied to either land or marine CSEM surveys.

In one example system, the noise frequencies will be chosen to be close enough to the frequency-of-interest to effectively model the noise at the frequency-of-interest. The best choice of noise frequencies will vary from data set to data set depending on the spectral content and other characteristics of the noise.

It will be apparent to those skilled in the art that the noise estimation model can be generalized from the linear model discussed above to include other mathematical operators. In particular, a convolution or filter could be applied to data values in some range of time to estimate the noise at a single time. Alternatively, the least squares method could be generalized to other mathematical optimization techniques, the time window used to design the coefficients could be generalized to include two or more time windows, or the $c_i$ coefficients could be generalized to include a linear time trend, as in $c_i + d_i * T$.

Returning to FIG. 4, once the noise is estimated by the noise estimator 430, the noise estimates are provided to a noise subtractor 435, which subtracts the estimated noise from the signal to produce an estimate of the Signal.

Figure 10:
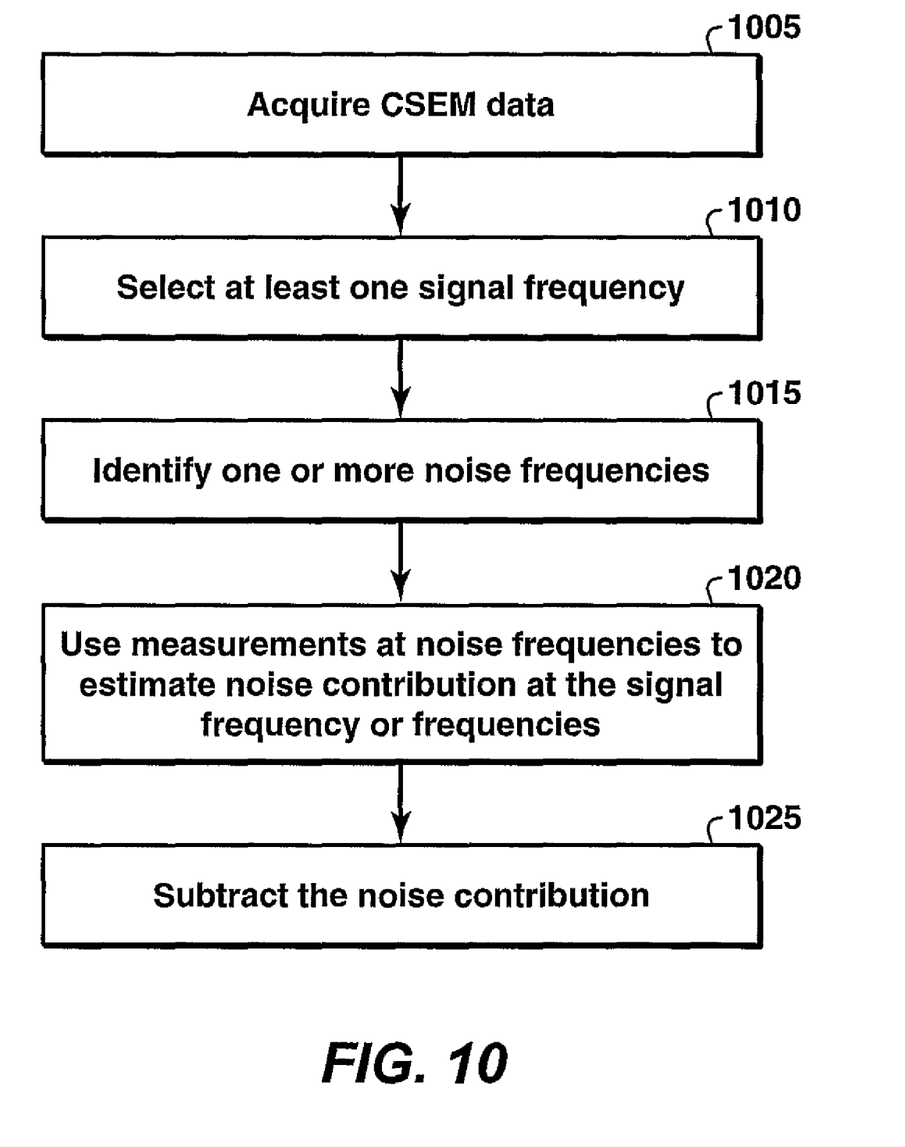
FIG. 10 is a flow chart depicting a technique for increasing the signal to noise ratio in CSEM data.

In an example of use, illustrated in FIG. 10, a CSEM system acquires CSEM data (block 1005). As discussed above, acquiring CSEM data involves receiving a received CSEM signal induced by a transmitted CSEM signal, where the transmitted CSEM signal has a known waveform with known amounts of energy at frequencies of interest and little or no energy at other frequencies. In a linear, noiseless environment, it would be expected that the received CSEM signal would have the same frequency content as the transmitted CSEM signal. Practically, the received CSEM signal contains both Signal and noise. The received CSEM signal is sampled with sufficient granularity (i.e., sample rate and dynamic range) to capture the frequencies-of-interest and the frequencies where little or no Signal is expected to be found.

The CSEM system then selects at least one signal frequency (block 1010). The signal frequencies are selected from among the frequencies-of-interest in the transmitted waveform. In most cases, fewer than all of the frequencies-of-interest will be selected.

The CSEM system then identifies one or more noise frequencies (block 1015). The noise frequencies are selected from among the frequencies where little or no energy was transmitted in the transmitted waveform. In most cases, fewer than all of the frequencies with little or no energy in the transmitted waveform will be selected.

The CSEM system then measures the energy at the selected noise frequency or frequencies at an offset where the noise at the frequencies-of-interest can readily be estimated from the noise at the noise frequencies, such as where the phase of the noise at the noise frequencies is likely to be close to the phase of the noise at the frequencies of interest. The CSEM system uses those measurements to estimate the noise energy at the selected signal frequencies (block 1020). For example, the estimating technique described above could be used.

The CSEM system then subtracts the estimated noise from the measured signal at the frequencies-of-interest (block 1025) to arrive at an estimate of the Signal at the frequencies-of-interest. In one example system, the subtraction is performed on a bin-by-bin basis.

Figure 11A:
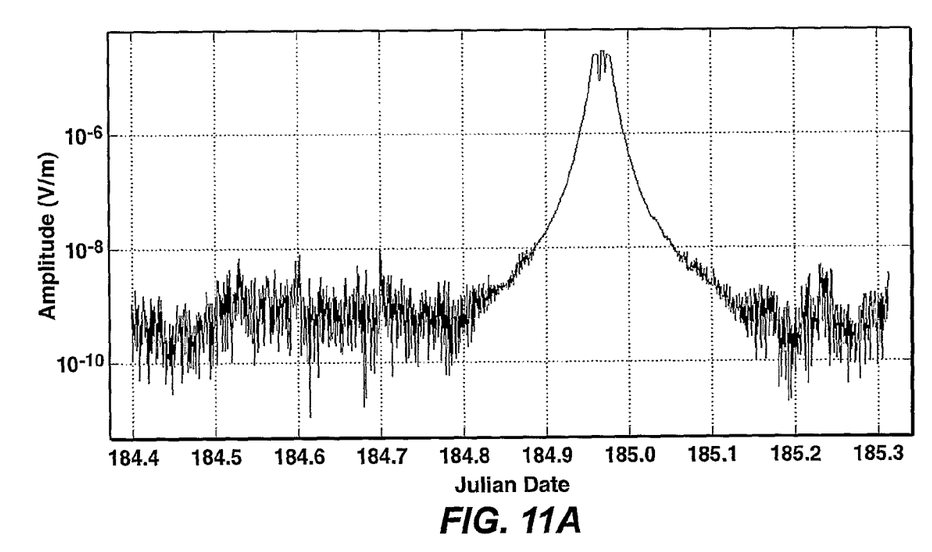
FIGS. 11-15 illustrate an example of the improvement in signal-to-noise ratio produced by practicing the technique described herein.
Figure 11B:
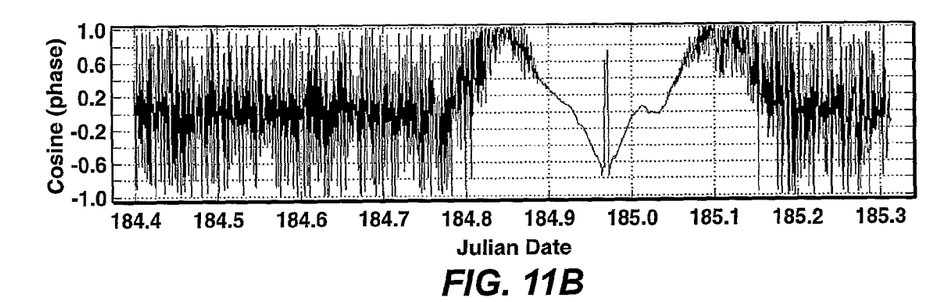

An example illustrating the operation of the technique described above is shown in FIGS. 11-15. In the example, a practical signal having the tripeak waveform shown in FIG. 6 with T=8 was transmitted. The original CSEM data is shown in FIG. 11. As mentioned above, FIG. 11 includes two charts: a chart reflecting the amplitude of the CSEM data (FIG. 11A) and a chart reflecting the phase of the CSEM data (FIG. 11B). The horizontal axis of both charts is offset measured in time, and specifically in Julian date. The Julian date ranges from about 184.4 to about 185.3, which is when the data was collected. In other analyses, offset might be measured by distance.

The vertical axis of the amplitude chart in FIG. 11A is the amplitude of the collected data in volts per meter measured at 0.0625 Hz, which is one of the frequencies of interest in the transmitted waveform of this example. The vertical axis uses a logarithmic scale ranging from about $10^{-6}$ to about $10^{-12}$ V/m. In an ideal noiseless environment, the data would follow a smooth curve. As can be seen from FIG. 11A, the data contains a fair amount of noise, especially below 184.8 days and above 185.1 days.

The vertical axis of the phase chart in FIG. 11B is the cosine of the phase of the collected data. In an ideal noiseless environment, the data would be smoothly distributed from −1 to 1. As can be seen from FIG. 11B, the data contains a fair amount of noise, especially below 184.8 days and above 185.1 days.

Figure 12A:
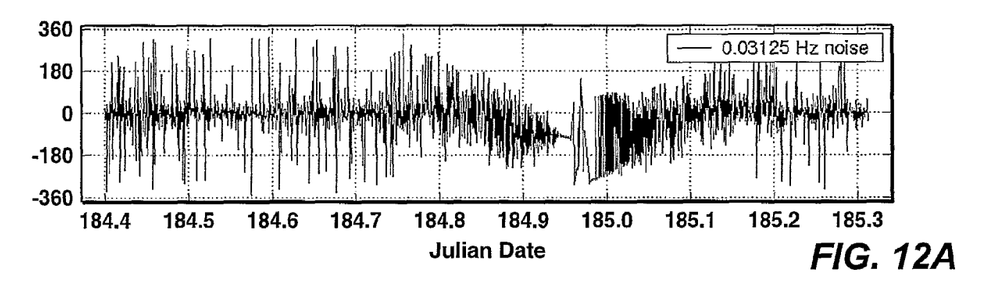
Figure 12B:
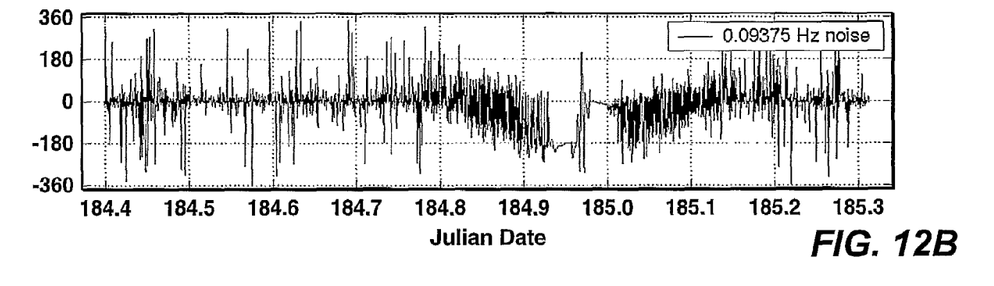
Figure 12C:
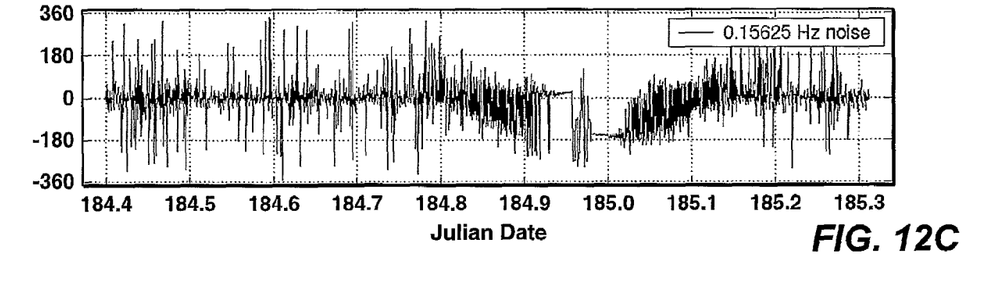

FIG. 12 shows the difference between the phase of the signal measured at one of the frequencies of interest, 0.0625 Hz, and the phase of the signal measured at three of the frequencies where little or no Signal is expected, 0.03125 Hz (FIG. 12A), 0.09375 Hz (FIG. 12B), and 0.15625 Hz (FIG. 12C), over the range of offsets.

A range of offsets was selected in which the difference in phase is small, which means that the noise at the frequency of interest should be readily modeled from the noise at frequencies where little or no Signal is expected. In the example shown in FIGS. 11-15, the data in the range from 184.5-184.6 was chosen to estimate the noise.

Figure 13A:
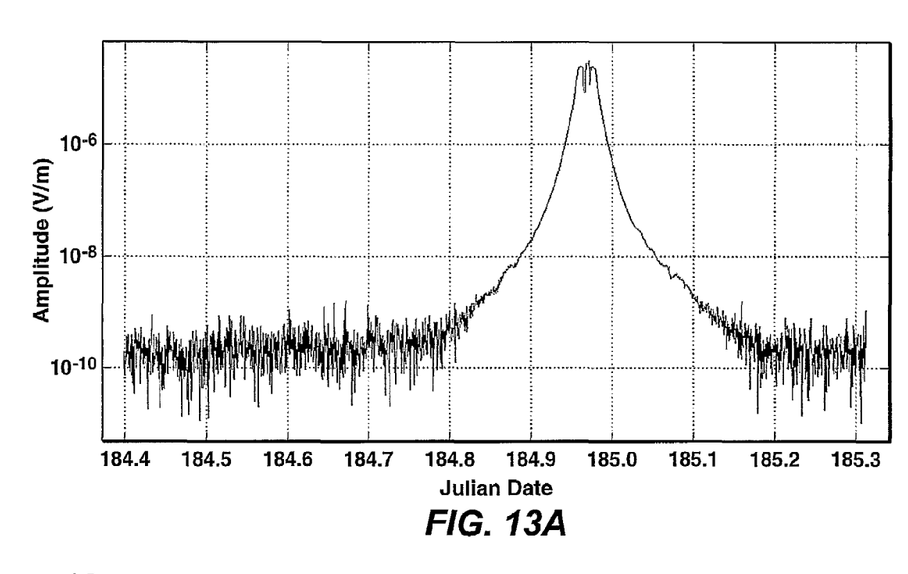
Figure 13B:
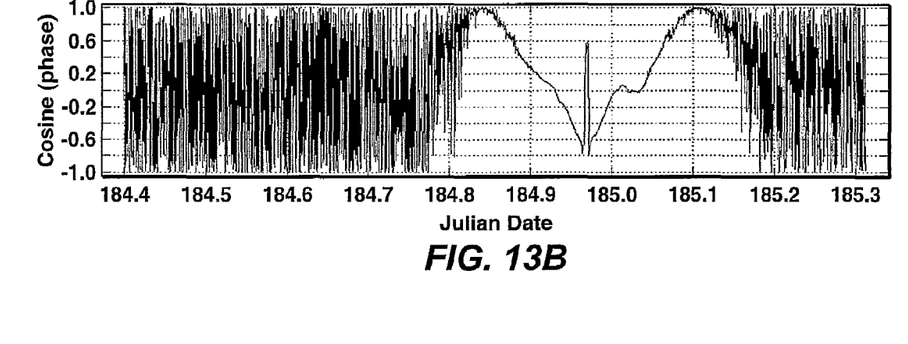
Figure 14A:
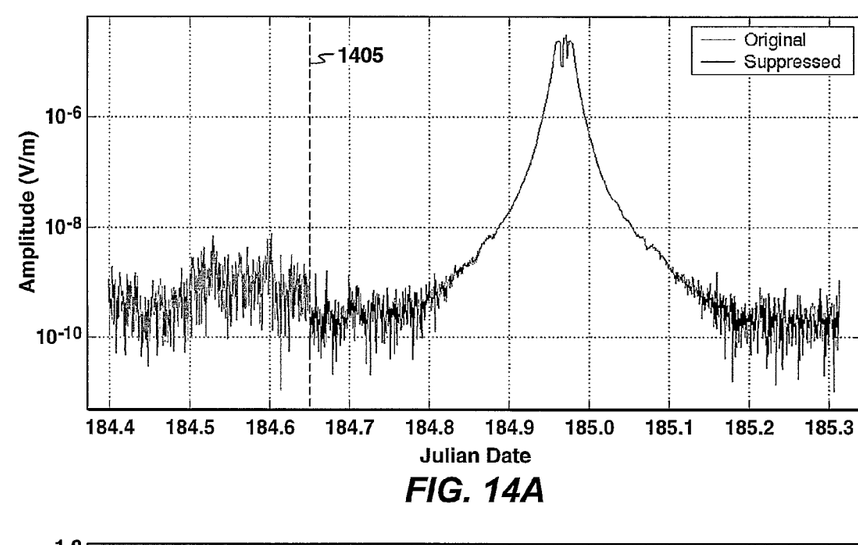
Figure 14B:
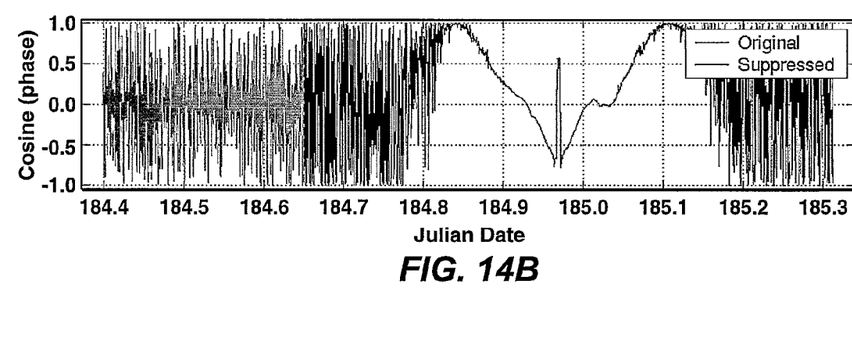

FIG. 13 shows the CSEM signal after noise suppression. Comparing FIG. 13 to FIG. 11, it can be seen that the noise level has dropped in both the amplitude chart (FIG. 13A) and in the phase chart (FIG. 13B). The reduction in noise is illustrated in FIGS. 14 and 15, which combine the chart of the signal before noise suppression and the chart of the signal after noise suppression. In FIG. 14, the data below 184.65 Julian days, where line 1405 is located, are the original data. The data above 184.65 Julian days are the data after the noise suppression technique has been applied. The reduction in noise is apparent from the reduction in the average amplitude in FIG. 14A. FIG. 14B shows the corresponding phase data.

Figure 15A:
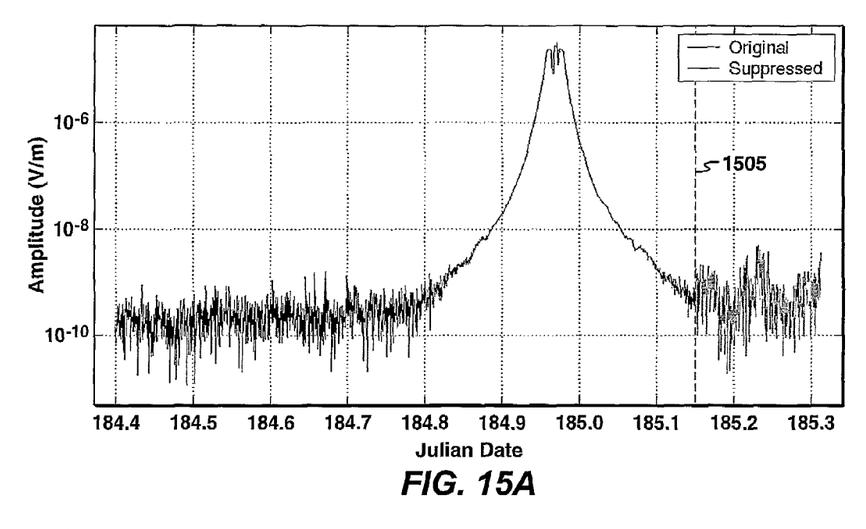
Figure 15B:
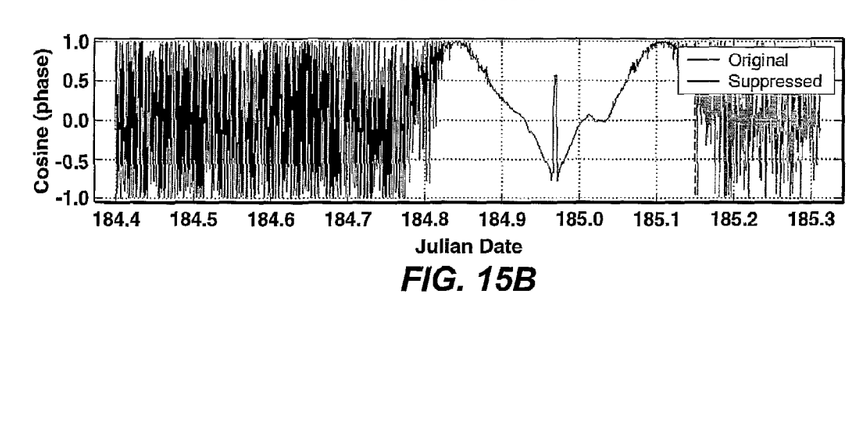

In FIG. 15, the data above 185.15 Julian days, where line 1505 are located, is the original data. The data below 185.15 Julian days are the data after the noise suppression technique has been applied. Again, the reduction in noise is apparent from the reduction in the average amplitude in FIG. 15A. The corresponding phase data is shown in FIG. 15B.

While the present invention has been described with reference to an exemplary embodiment thereof, those skilled in the art will know of various changes in form that may be made without departing from the spirit and scope of the claimed invention as defined in the appended claims. For example, the person skilled in the art will recognize that different techniques for modeling the noise, other than that shown in Equations 1 and 2, could be used. As another example, the person skilled in the art will recognize that the transducer 105 might be replaced with a magnetic dipole, that the antenna 215 might be replaced with a magnetic antenna, or that both transducer 105 and antenna 215 might be replaced with magnetic devices. All such variations will be deemed included in the following claims.

What is claimed is:

1. A method for improving the signal-to-noise ratio of a signal S(t), S(t) containing Signal and noise, the method comprising:

(a) obtaining a measurement of S(t) at a frequency-of-interest;

(b) obtaining noise measurements of S(t) at one or more noise frequencies where the Signal portion of S(t) is expected to be small;

(c) estimating the noise at the frequency-of-interest using the noise measurements at the one or more noise frequencies, wherein estimating the noise at the frequency-of-interest, N(T), comprises:

$$\text{minimizing} \sum_{T \in \{T_1, T_2\}} |S(T) - N(T)|^2 \text{ where } N(T) =$$

$$c_1 n_1(T) + c_2 n_2(T) + c_3 n_3(T) + \dots ;$$

and;

where $c_1$, $c_2$, $c_3$, ... are complex coefficients; $n_1$, $n_2$, $n_3$, ... are the measurements of noise at the noise frequencies; and T1 and T2 define a time period when little or no Signal is present in S(t); and (d) subtracting the estimated noise from the measurement of S(t) at the frequency-of-interest.

2. The method of claim 1 further comprising:
repeating (a), (b), (c) and (d).

3. The method of claim 1 where obtaining noise measurements of S(t) at the one or more noise frequencies comprises:
selecting the noise frequencies such that they will readily model the noise at the frequency-of-interest.

4. The method of claim 1 where obtaining noise measurements of S(t) at the one or more noise frequencies comprises:
selecting the noise frequencies to be close to the frequency-of-interest.

5. The method of claim 1 where obtaining noise measurements of S(t) at the one or more noise frequencies comprises:
obtaining measurements of S(t) at a time when the Signal portion of S(t) is expected to be small.

6. The method of claim 1 where the measurements comprise data, the data comprises offset, amplitude and phase, and estimating the noise comprises:
sorting the data into bins, each bin being associated with a respective range of offsets;
transforming the data in each bin into the frequency domain;
selecting from each bin data associated with the frequency-of-interest;
selecting from each bin data associated with the one or more noise frequencies;
estimating, for each bin, a frequency-of-interest noise from the selected noise frequency data; and
subtracting, on a bin-by-bin basis, the estimated frequency-of-interest noise from the data associated with the frequency-of-interest.

7. The method of claim 1, where:
obtaining a measurement of S(t) at the frequency-of-interest comprises obtaining measurements of the complex amplitude of S(t) at the frequency-of-interest;
obtaining noise measurements of S(t) at the one or more noise frequencies comprises obtaining measurements of the complex amplitude of S(t) at the plurality of noise frequencies;
estimating the noise comprises estimating the complex amplitude of the noise at the frequency-of-interest using the complex amplitudes of S(t) obtained at the one or more noise frequencies; and
subtracting the estimated noise comprises subtracting the complex amplitude of the estimated noise at the frequency-of-interest from the complex amplitude of S(t) obtained at the frequency-of-interest.

8. The method of claim 1 further comprising:
generating a CSEM signal having a large amount of energy at the frequency-of-interest and small amount of energy at a plurality of low-signal frequencies;
transmitting the CSEM signal; and
receiving the signal S(t).

9. The method of claim 8 further comprising:
selecting a frequency for the CSEM signal.

10. The method of claim 8 where generating the CSEM signal comprises:
generating a CSEM signal in which the energy of the CSEM signal is concentrated into temporal frequencies suited to distinguish hydrocarbon reservoirs.

11. The method of claim 8 further comprising:
selecting the noise frequencies to coincide with a subset of the low-signal frequencies.

12. The method of claim 8 further comprising:
selecting the noise frequencies to avoid frequency components of the transmitted CSEM signal.

13. The method of claim 8 where generating a CSEM signal comprises:
generating a square wave.

14. The method of claim 8 where generating a CSEM signal comprises:
generating a tripeak wave.

15. A computer program, stored in a tangible medium, for improving the signal-to-noise ratio of a signal S(t), S(t) containing Signal and noise, the program comprising executable instructions that cause a computer to:
(a) obtain a measurement of S(t) at a frequency-of-interest;
(b) obtain noise measurements of S(t) at one or more noise frequencies where the Signal portion of S(t) is expected to be small;
(c) estimate the noise at the frequency-of-interest using the noise measurements at the one or more noise frequencies, wherein when estimating the noise, N(T), at the frequency-of-interest, the computer:

$$\text{minimizes} \sum_{T \in [T_1, T_2]} |S(T) - N(T)|^2 \text{ where } N(T) = c_1 n_1(T) + c_2 n_2(T) + c_3 n_3(T) + \ldots ;$$

and
where $c_1$, $c_2$, $c_3$, ... are complex coefficients; $n_1$, $n_2$, $n_3$, ... are the measurements of noise at the noise frequencies; and T1 and T2 define a time period when little or no Signal is present in S(t); and
(d) subtract the estimated noise from the measurement of S(t) at the frequency-of-interest.

16. The computer program of claim 15 where the program further comprises executable instructions that cause the computer to:
repeat (a), (b), (c) and (d).

17. The computer program of claim 15 where, when obtaining noise measurements of S(t) at the one or more noise frequencies, the computer:
selects the noise frequencies such that they will readily model the noise at the frequency-of-interest.

18. The computer program of claim 15 where, when obtaining noise measurements of S(t) at the one or more noise frequencies, the computer:
selects the noise frequencies to be close to the frequency-of-interest.

19. The computer program of claim 15 where, when obtaining noise measurements of S(t) at the one or more noise frequencies, the computer:
obtains measurements of S(t) at time when the Signal portion of S(t) is expected to be small.

20. The computer program of claim 15 where the measurements comprise data, the data comprises offset, amplitude and phase, and, when estimating the noise, the computer:
sorts the data into bins, each bin being associated with a respective range of offsets;
transforms the data in each bin into the frequency domain;
selects from each bin data associated with the frequency-of-interest;
selects from each bin data associated with the one or more noise frequencies;
estimates, for each bin, a frequency-of-interest noise from the selected noise frequency data; and
subtracts, on a bin-by-bin basis, the estimated frequency-of-interest noise from the data associated with the frequency-of-interest.

21. The computer program of claim 15, where:
when obtaining a measurement of S(t) at the frequency-of-interest, the computer obtains measurements of the complex amplitude of S(t) at the frequency-of-interest;
when obtaining noise measurements of S(t) at the one or more noise frequencies, the computer obtains measurements of the complex amplitude of S(t) at the one or more noise frequencies;
when estimating the noise, the computer estimates the complex amplitude of the noise at the frequency-of-interest using the complex amplitudes of S(t) obtained at the one or more noise frequencies; and
when subtracting the estimated noise comprises, the computer subtracts the complex amplitude of the estimated noise at the frequency-of-interest from the complex amplitude of S(t) obtained at the frequency-of-interest.

22. The computer program of claim 15, the program further comprising executable instructions that cause the computer to:
generate a CSEM signal having a large amount of energy at the frequency-of-interest and small amount of energy at a plurality of low-signal frequencies;
transmit the CSEM signal; and
receive the signal S(t).

23. The computer program of claim 22, the program further comprising executable instructions that cause the computer to:
select a frequency for the CSEM signal.

24. The computer program of claim 22 where, when generating a CSEM signal, the computer:
generates a CSEM signal in which the energy of the CSEM signal is concentrated into temporal frequencies suited to distinguishing hydrocarbon reservoirs.

25. The computer program of claim 22, the program further comprising executable instructions that cause the computer to:
select the noise frequencies to coincide with a subset of the low-signal frequencies.

26. The computer program of claim 22, the program further comprising executable instructions that cause the computer to:
select the noise frequencies to avoid frequency components of the transmitted CSEM signal.

27. The computer program of claim 22 where, when generating a CSEM signal, the computer:
generates a square wave.

28. The computer program of claim 22 where, when generating a CSEM signal, the computer:
generates a tripeak wave.

29. A CSEM apparatus for estimating noise at one frequency in a signal S(t), which contains Signal and noise, by sampling noise in S(t) at other frequencies, the apparatus comprising:
a noise estimator to determine an estimate of the noise in S(t) at a frequency-of-interest using the measured noise in S(t) at certain noise frequencies;
a noise subtractor to subtract the estimate of noise from S(t) at the frequency-of-interest;
one or more antennae;
one or more analog to digital converters coupled to the antennae, each producing data representing S(t); and
a data transformer to transform the data from the time domain to the frequency domain.

30. The CSEM apparatus of claim 29 further comprising:
a recorder coupled to the analog to digital converter, the recorder recording the output of the analog to digital converter.

31. The CSEM apparatus of claim 29 further comprising:
a data binner coupled to the analog to digital converter to sort its output into bins based on offset.

32. The CSEM apparatus of claim 29 further comprising:
conditioning components coupled to the antennae.

33. The CSEM apparatus of claim 29, where the noise estimator minimizes $$\sum_{T \in [T_1, T_2]} |S(T) - N(T)|^2 \text{ where } N(T) = c_1 n_1(T) + c_2 n_2(T) + c_3 n_3(T) + \ldots ;$$

$$c_1, c_2, c_3, \ldots$$

are complex coefficients; $n_1, n_2, n_3, \ldots$ are the measurements of noise at the noise frequencies; and T1 and T2 define a time period when little or no Signal is present in S(t).

34. The CSEM apparatus of claim 29 where the noise estimator estimates the noise received on a single antenna.

35. The CSEM apparatus of claim 29 where the noise estimator estimates the noise received on two or more antennae.

36. A method for improving the signal-to-noise ratio of a signal S(t), S(t) containing Signal and noise, the method comprising:
(a) obtaining a measurement of S(t) at a frequency-of-interest;
(b) obtaining noise measurements of S(t) at one or more noise frequencies where the Signal portion of S(t) is expected to be small;
wherein the measurements in (a) and (b) comprise data, and the data comprise offset, amplitude and phase;
(c) sorting the data into bins, each bin being associated with a respective range of offsets;
(d) transforming the data in each bin into the frequency domain;
(e) selecting from each bin data associated with the frequency-of-interest;
(f) selecting from each bin data associated with the one or more noise frequencies;
(g) estimating, for each bin, a frequency-of-interest noise from the selected noise frequency data; and
(h) subtracting, on a bin-by-bin basis, the estimated frequency-of-interest noise from the data associated with the frequency-of-interest.

* * * * *